(12) United States Patent
Jen et al.

(10) Patent No.: US 7,098,987 B1
(45) Date of Patent: Aug. 29, 2006

(54) ARRAY OF ACTIVE DEVICES AND METHOD FOR TESTING AN ARRAY OF ACTIVE DEVICES

(75) Inventors: Chien-Chih Jen, Taipei (TW); Chun-Hung Tung, Pingtung (TW); Fu-Yuan Shiau, Chiayi (TW); Yuan-Hao Chang, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/161,952

(22) Filed: Aug. 24, 2005

(51) Int. Cl.
*G02F 1/1345* (2006.01)
(52) U.S. Cl. ....................................... 349/152
(58) Field of Classification Search ................ 349/43, 349/152, 192
See application file for complete search history.

(56) References Cited

U.S. PATENT DOCUMENTS

2003/0210359 A1* 11/2003 Lee et al. ..................... 349/43

* cited by examiner

*Primary Examiner*—James A. Dudek
(74) *Attorney, Agent, or Firm*—Jianq Chyun IP Office

(57) ABSTRACT

An array of active devices and a method for testing an array of active devices are provided. The array comprises a substrate, a plurality of scan lines, a plurality of data lines, a plurality of pixel units and a plurality of test pads. The substrate comprises a display area and a peripheral area. The scan lines and the data lines are positioned on the substrate, and enclose a plurality of pixel areas and dummy pixel areas in the display area and the peripheral area, respectively. The pixel units are positioned in the pixel areas and are connected to the scan lines and the data lines, respectively. Finally, The test pads are positioned close to the scan lines and/or the data lines, and positioned on the substrate and in the peripheral area. Each of the test pads is connected to the corresponding data line or the corresponding scan line.

11 Claims, 7 Drawing Sheets

ARRAY OF ACTIVE DEVICES AND METHOD FOR TESTING AN ARRAY OF ACTIVE DEVICES

BACKGROUND OF THE INVENTION

1. Field of the Invention

The present invention relates to an array of active devices. More particularly, the present invention relates to an array of active devices and a method for testing an array of active devices with high testing accuracy.

2. Description of the Related Art

The demand for displays is getting greater. Therefore, the industry spares no effort in their research and development. Among various types of displays, the flat panel display is taking over the dominating position because of its superior characteristics such as high picture quality, small foot print, low power consumption, and absence of radiation.

At present, the major types of flat panel display include liquid crystal display (LCD), organic electro-luminescence display (OELD), and plasma display panel (PDP), etc. Among them, the LCD and the OELD are generally driven by active devices to shorten the response time of displays.

Besides, due to the demand for higher resolution and smaller size, the technology of mounting and packaging driver integrated circuits (IC) on display panels has shifted gradually from chip on board (COB) to tape automated bonding (TAB), and afterwards to chip on glass (COG), which features fine pitches between the pins of integrated circuits.

FIG. 1 is a schematic diagram showing a display panel driven by active devices using the conventional COG technology. Please refer to FIG. 1, the display panel 100 driven by active devices comprises the display area 102 and the peripheral area 104. The display area 102 comprises a plurality of scan lines 112, a plurality of data lines 114, and a plurality of pixel units 116 connected to the scan lines 112 and the data lines 114. The peripheral area 104 comprises a plurality of gate drivers 120 and a plurality of data drivers 130. The gate drivers 120 are electrically connected to the scan lines 112, while the data drivers 130 are electrically connected to the data lines 114. In other words, the scan lines 112 and the data lines 114 are driven by the gate drivers 120 and the data drivers 130, respectively.

In the fabrication process of active flat panel display, the completion of the display panel 100 in FIG. 1 is usually followed by a circuit test to verify whether there are any defects generated on the circuit of the display panel 100 during the fabrication process. FIG. 2 shows the conventional deployment of test pads for testing the display panel 100 in FIG. 1. Please refer to FIG. 1 and FIG. 2, apart from the gate drivers 120 and the data drivers 130, the peripheral area 104 of the display panel 100 further comprises a plurality of test pads 140 for circuit testing. The test pads 140 are connected to the receiving pads 132 of the data drivers 130 (or the gate drivers 120), respectively.

In the circuit test mentioned above, the tester uses the probe 108 to send test signals to the test pads 140. The test signals will be provided to the display area 102 via the test pads 140 to test the pixel units 116 within the display area 102. For saving space in medium-size and small-size display panels, the receiving pads 132 of the gate drivers 120 and the data drivers 130 are arranged in an interleaved way on the display panel, as shown in FIG. 2.

Furthermore, for increasing the resolution of current medium-sized and small-sized display panels, the sizes of and the distances between the test pads 140 and the receiving pads 132 are getting minimized. Taking a 5.5-inch display panel for example, the area of a test pad 140 is about 36 micrometers by 150 micrometers, and the distance d is about 24 micrometers. For test pads of such size, the probe 108 used in the test has to be smaller and more accurate. However, such probes are expensive and will increase the cost of testing the display panel 100.

Besides, as the distance d between the test pads 140 is getting smaller, the accuracy of the test is bound to deteriorate because the probe 108 may probe into wrong positions and adjacent test signals may interfere with one another during the circuit test.

SUMMARY OF THE INVENTION

Accordingly, the present invention is directed to an array of active devices, whose test pads help to reduce the difficulty and to improve the accuracy of the circuit test.

The present invention is also directed to a method for testing an array of active devices for improving the accuracy of the circuit test on arrays of active devices.

According to an embodiment of the present invention, an array of active devices is provided. The array comprises a substrate, a plurality of scan lines, a plurality of data lines, a plurality of pixel units and a plurality of test pads. The substrate comprises a display area and a peripheral area. The scan lines and the data lines are positioned on the substrate, and enclose a plurality of pixel areas and dummy pixel areas in the display area and the peripheral area, respectively. The pixel units are positioned in the pixel areas and are connected to the scan lines and the data lines, respectively. Finally, The test pads are positioned close to the scan lines and/or the data lines, and positioned on the substrate and in the peripheral area. Each of the test pads is connected to one of the data lines or one of the scan lines.

In an embodiment of the present invention, each of the pixel units comprises a first active device and a pixel electrode. The first active device is connected to the corresponding scan line and the corresponding data line. The pixel electrode is formed of, for example, Indium Tin Oxide (ITO) or Indium Zinc Oxide (IZO), and is connected to the first active device.

In an embodiment of the present invention, each of the test pads is positioned in one of the dummy pixel areas and is connected to the corresponding data line. The test pads are formed of, for example, Indium Tin Oxide (ITO) or Indium Zinc Oxide (IZO). Moreover, in an embodiment of the present invention, the array of active devices further comprises a plurality of second active devices. The second active devices are positioned on the substrate and in the dummy pixel areas. The second active devices are always turned on and in each of the dummy pixel areas the corresponding test pad is connected to the corresponding data line through the corresponding second active device. Besides, the second active devices are, for example, thin film transistors, and the source terminal and the drain terminal of each of the thin film transistors are connected together.

In an embodiment of the present invention, the test pads are positioned outside the dummy pixel areas, and are formed of, for example, metal.

According to another embodiment of the present invention, a method for testing an array of active devices is provided. The method is suitable for testing an array of active devices. The array of active devices comprises a plurality of pixel structures and a plurality of dummy pixel structures. Each of the pixel structures comprises a first active device, while each of the dummy pixel structures comprises a second active device. The dummy pixel structures are connected to the pixel structures, respectively. The method comprises the steps of turning on the first active devices, turning on the second active devices, and providing a test signal to each of the dummy pixel structures to transmit the test signals through the dummy pixel structures to the pixel structures.

In an embodiment of the present invention, each dummy pixel structure of the array of active devices further comprises a dummy pixel electrode, and the step of providing the test signals further comprises providing the test signals to the dummy pixel electrodes. The test signals will be transmitted from the dummy pixel electrodes through the second active devices to the pixel structures.

The sizes of and the distances between the test pads in the arrays of active devices according to the present invention are large enough to reduce the difficulty and to improve the accuracy of the circuit test on arrays of active devices. In addition, it is no longer necessary to spend precious budgets on expensive probes with high accuracy.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
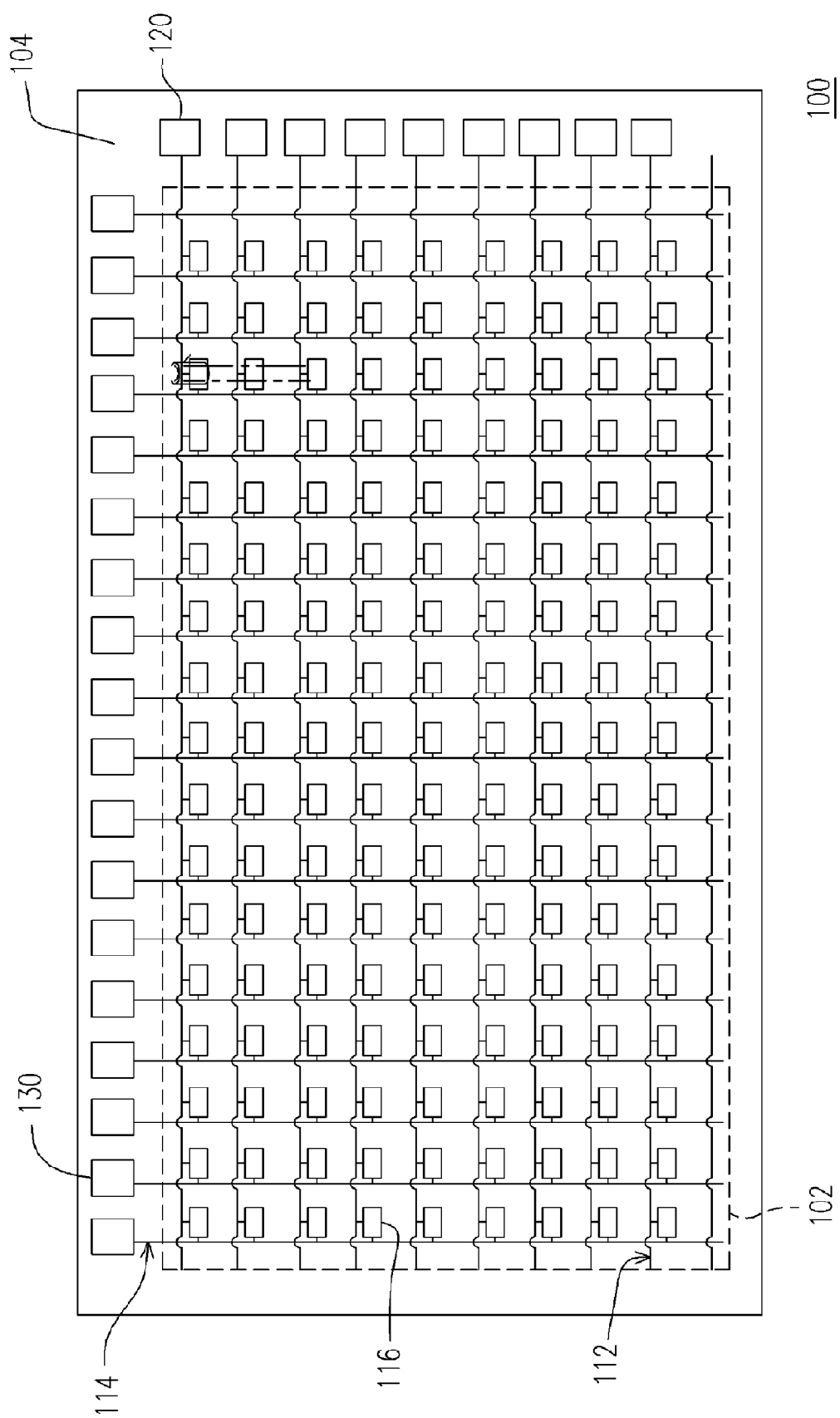
FIG. 1 is a schematic diagram showing a display panel driven by active devices using the conventional COG technology.
Figure 2:
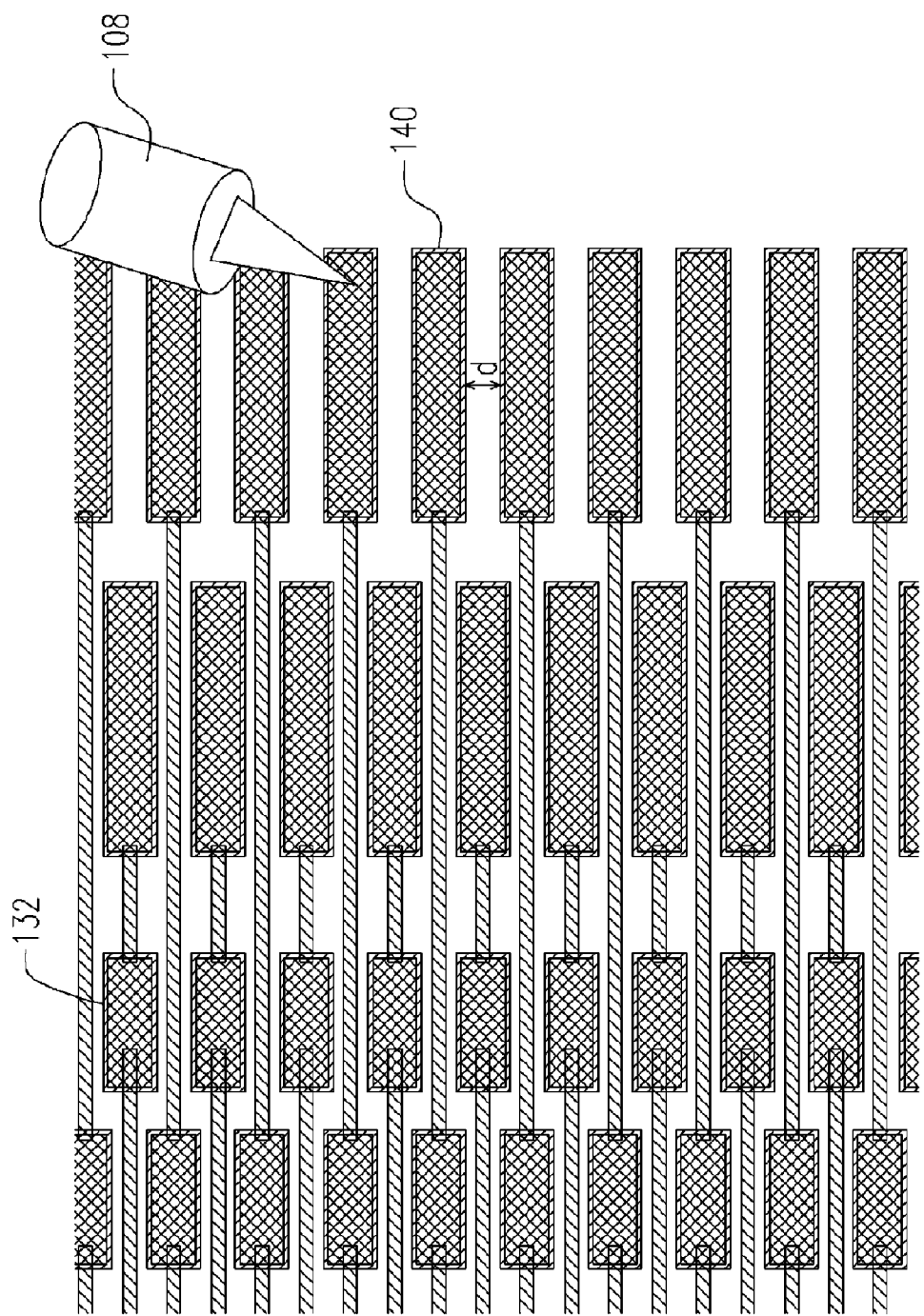
FIG. 2 shows the conventional deployment of test pads for testing the display panel 100 in FIG. 1.

Reference will now be made in detail to the present preferred embodiments of the invention, examples of which are illustrated in the accompanying drawings. Wherever possible, the same reference numbers are used in the drawings and the description to refer to the same or like parts.

The present invention uses dummy pixels available in general arrays of active devices as test pads to transmit test signals to prevent adjacent signals from interfering with one another in the circuit test. The following are detailed descriptions of the embodiments of the present invention.

Figure 3:
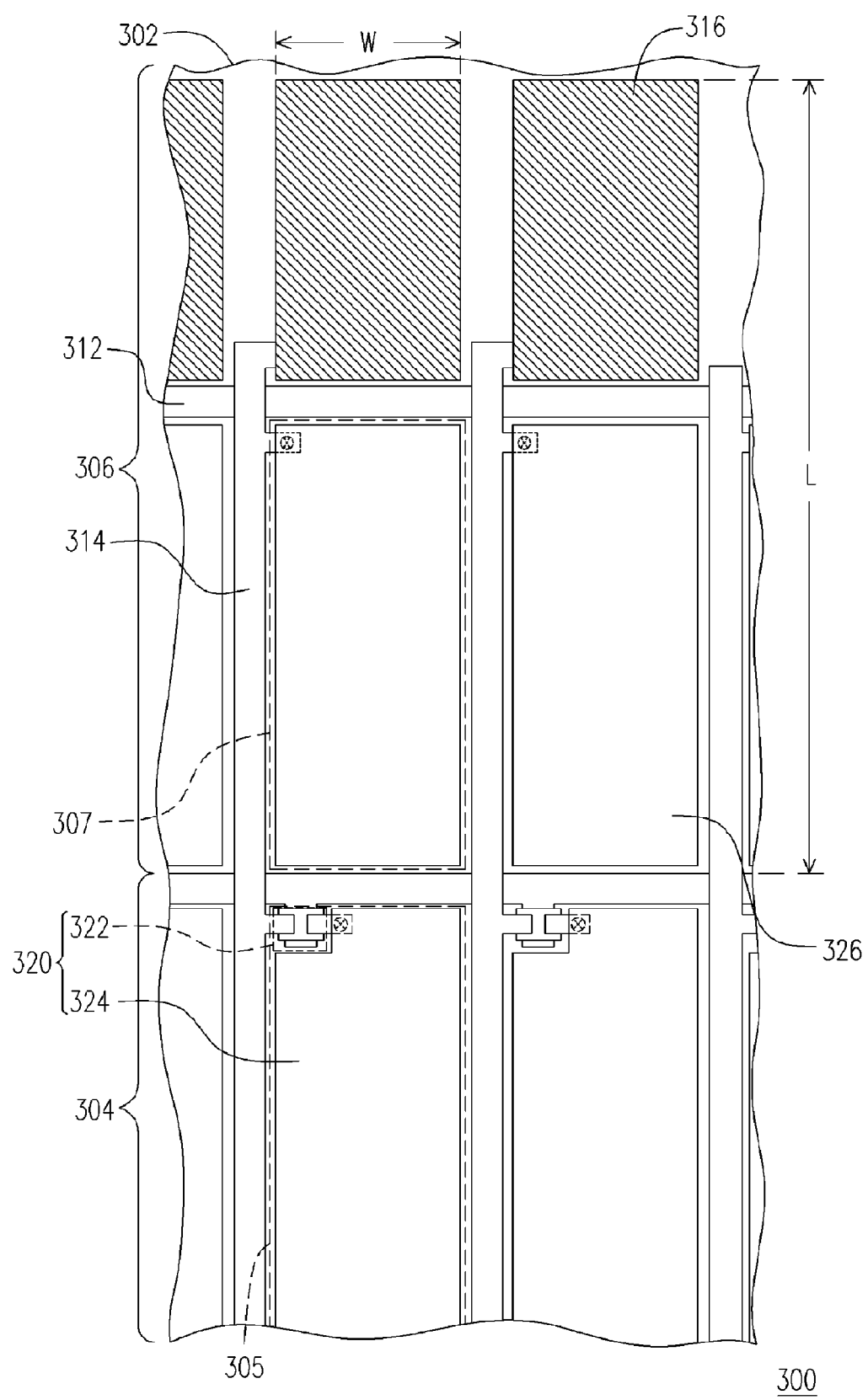
FIG. 3 is a schematic diagram showing part of an array of active devices according to the first embodiment of the present invention.

FIG. 3 is a schematic diagram showing part of an array of active devices according to the first embodiment of the present invention. Please refer to FIG. 3, the array 300 of active devices comprises the substrate 302, a plurality of scan lines 312, a plurality of data lines 314, a plurality of test pads 316 and a plurality of pixel units 320. The substrate 302 is divided into two areas, namely, the display area 304 and the peripheral area 306. The scan lines 312 and the data lines 314 are positioned on the substrate 302 and enclose a plurality of pixel areas 305 in the display area 304. Furthermore, the scan lines 312 and the data lines 314 enclose a plurality of dummy pixel areas 307 in the peripheral area 306.

Continued from the above, each of the pixel units 320 is positioned in a single pixel area 305, and a pixel unit 320 comprises a first active device 322 and a pixel electrode 324. The pixel electrode 324 is connected to the first active device 322, and the first active device 322 is connected to a scan line 312 and a data line 314. The first active device 322 drives the pixel electrode 324 in response to signals received from the scan line 312 and the data line 314. In an embodiment of the present invention, the first active device 322 is, for example, a thin film transistor, and the pixel electrode 324 is formed of, for example, Indium Tin Oxide (ITO) or Indium Zinc Oxide (IZO).

Please refer to FIG. 3, the test pads 316 are positioned outside the dummy pixel areas 307. In this embodiment, the test pads 316 are, for example, positioned close to the scan lines 312 on the edge of the display area 304, and connected to the data lines 314. The test pads 316 are formed of, for example, metal, and are fabricated in the same step of the fabrication process as that of the data lines 314 or in an extra step. Particularly, the dummy pixel areas 307 in this embodiment do not include any active devices. Therefore, after the tester provides test signals to the test pads 316, the test signals will be transmitted to the pixel units 320 in the display area 304 through the data lines 314 for the circuit test.

Please refer to FIG. 3, the test pads 316 in this embodiment have the same width w as that of the pixel electrodes 324. Besides, because the transparent electrodes 326 in the dummy pixel areas 307 are also connected to the data lines 314, in the test, the probe (not shown) may provide test signals to the test pads 316 or the transparent electrodes 326 so that the test signals will be transmitted to the pixel units 320 via the data lines 314. In other words, the transparent electrodes 326 can be regarded as part of the test pads 316. In an embodiment of the present invention, the width w of a test pad 316 is, for example, 63 micrometers, and the total length L of a test pad 316 together with a transparent electrode 326 is, for example, 508 micrometers. Therefore, the size of a test pad 316 is large enough to prevent the probe from probing into wrong positions in the circuit test.

In this embodiment, the test pads 316 are connected to the data lines 314. In fact, test signals may be transmitted to the pixel units 320 via the scan lines 312 or the data lines 314. Therefore, the present invention does not limit whether the test pads for transmitting the test signals are connected to the data lines 314 or the scan lines 312.

Figure 4:
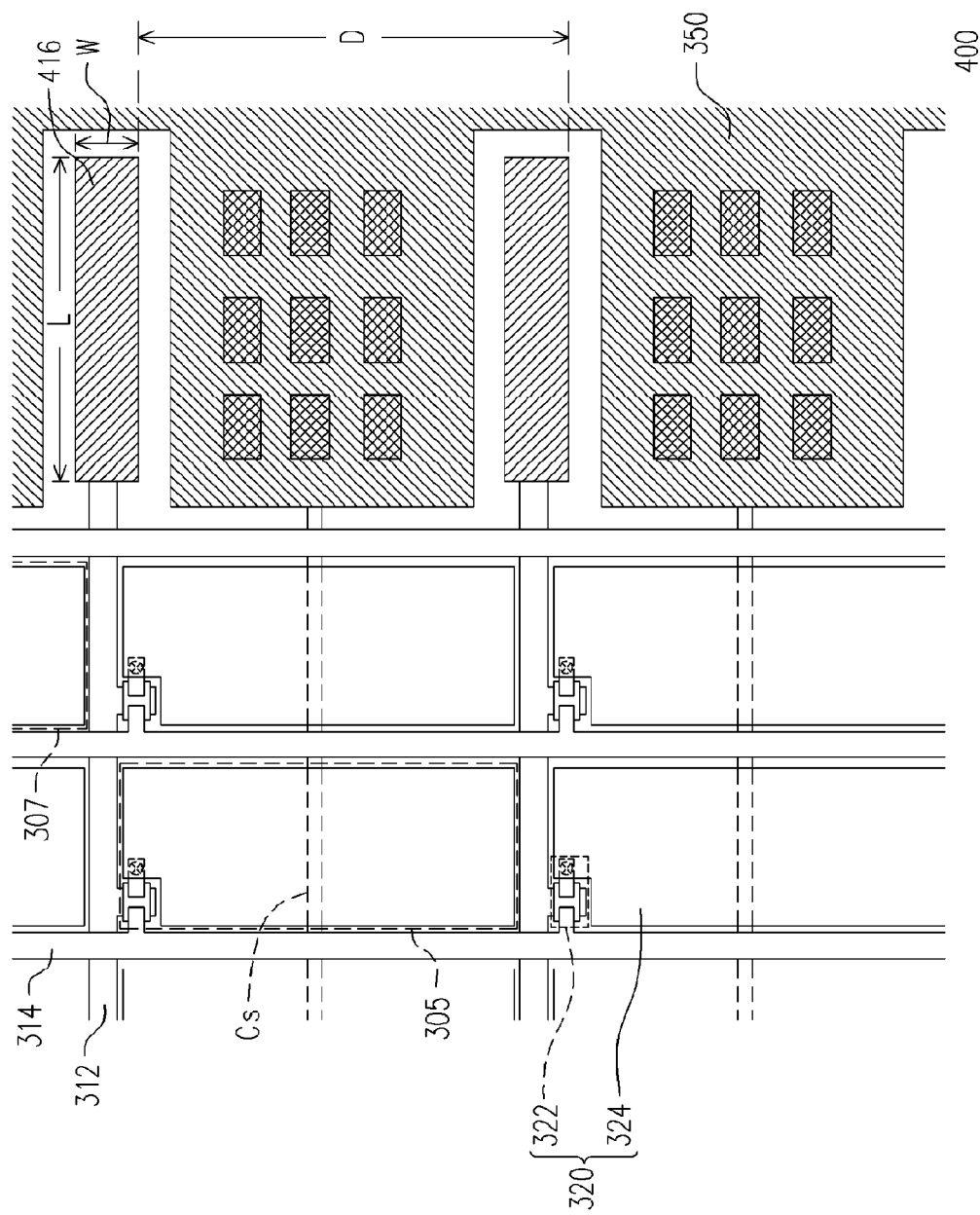
FIG. 4 is a schematic diagram showing part of an array of active devices according to the second embodiment of the present invention.

FIG. 4 is a schematic diagram showing part of an array of active devices according to the second embodiment of the present invention. Please refer to FIG. 4, in this embodiment, the test pads 416 are connected to the scan lines 312. The pixel areas 305 for example comprises the storage capacitors Cs. The test pads 416 are positioned, for example, between the bus electrodes 350 connected to the storage capacitors Cs. Particularly, in this positioning, the distance D between adjacent test pads 416 can be widened to, for example, 242 micrometers to reduce the difficulty and to enhance the accuracy of testing the array 400 of active devices. Besides, the length L of a test pad 416 is, for example, 275 micrometers and the width w of a test pad 416 is, for example, 50 micrometers. Of course, the size of the test pads 416 is large enough to prevent the probe (not shown) from probing into wrong positions when testing the array 400 of active devices.

Moreover, the present invention may use electrodes positioned in the dummy pixel areas directly as test pads and achieves advantages similar to those of the previous embodiments. This will be discussed with reference to the following embodiment.

Figure 5:
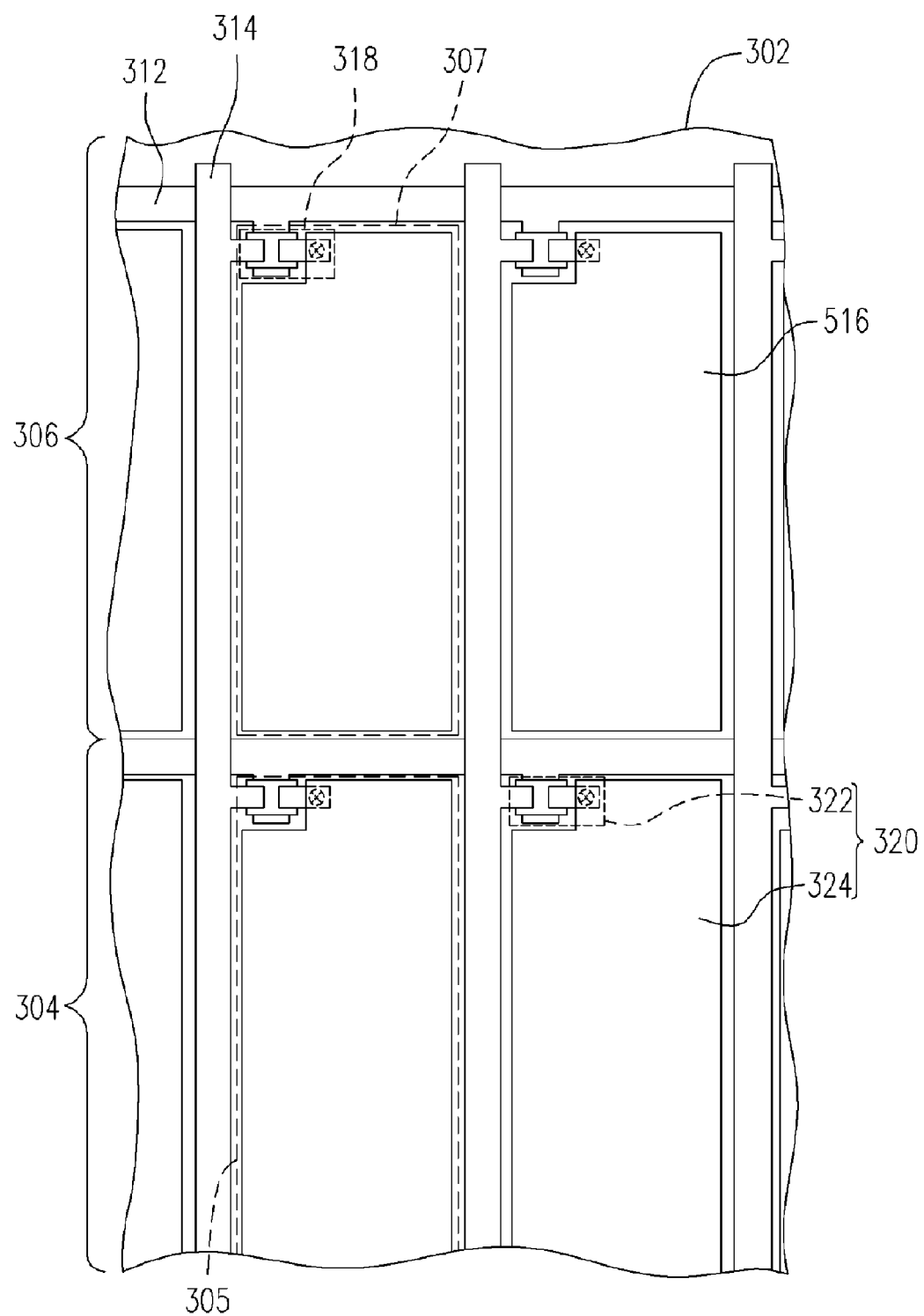
FIG. 5 is a schematic diagram showing part of an array of active devices according to the third embodiment of the present invention.

FIG. 5 is a schematic diagram showing part of an array of active devices according to the third embodiment of the present invention. Please note that the major components of the array 500 of active devices in FIG. 5 are essentially the same as the major components of the array 300 of active devices in FIG. 3. Therefore the following will discuss only the differences between the array 500 of active devices and the array 300 of the active devices.

Please refer to FIG. 5, the test pads 516 are positioned on the substrate 302. Each of the test pads 516 is positioned in a single dummy pixel area 307 and is connected to a corresponding data line 314. Please note that, in a preferred embodiment, the test pads are, for example, transparent electrodes fabricated in the same step of the fabrication process as that of the pixel electrodes 324. In other words, the test pads 516 are formed of, for example, the same material as that of the pixel electrodes 324, namely, ITO or IZO.

More particularly, the array 500 of active devices in this embodiment comprises, for example, a plurality of second active devices 318, which are always turned on. The second active devices 318 are, for example, thin film transistors, and the source terminal and the drain terminal of each of the thin film transistors are connected together. Each of the second active devices 318 is positioned in a dummy pixel area 307, and the test pad 516 in each of the dummy pixel area 307 is connected to the data lines 314 through a second active device 318.

Please refer to FIG. 5 again, in the test of the array 500 of active devices, after the tester provides test signals by way of the probe (not shown) to the test pads 516, the test signals will be transmitted to the pixel units 320 through the data lines 324 connected to the test pads 516 to test each of the pixel units 320. In this embodiment, the size of a test pad 516 is determined according to the size of a dummy pixel area 307, and the size of a dummy pixel area 307 is generally the same as that of a pixel area 305. Therefore, the size of the test pads 516 is large enough to prevent the probe from probing into wrong positions in the circuit test.

In this embodiment, the second active devices 318 in the dummy pixel areas 307 of the array 500 of active devices are always turned on so that the electrodes in the dummy pixel areas 307 can be used as the test pads 516 to save the layout space of the array 500 of active devices. Besides, the test pads 516 may be fabricated in the same step of the fabrication process as that of the pixel electrodes 324. Therefore, the fabrication cost of the array 500 of active devices can be lower than that of the prior art because the step to fabricate the test pads is unnecessary.

However, even though the second active devices 318 in the dummy pixel areas 307 are the same normal active devices as the first active devices 322 in the pixel area 305, the present invention may still use the transparent electrodes positioned in the dummy pixel areas 307 directly as the test pads 516 to deliver test signals to the pixel units 320 in the display area 304. This will be discussed with reference to the following embodiment.

Figure 6:
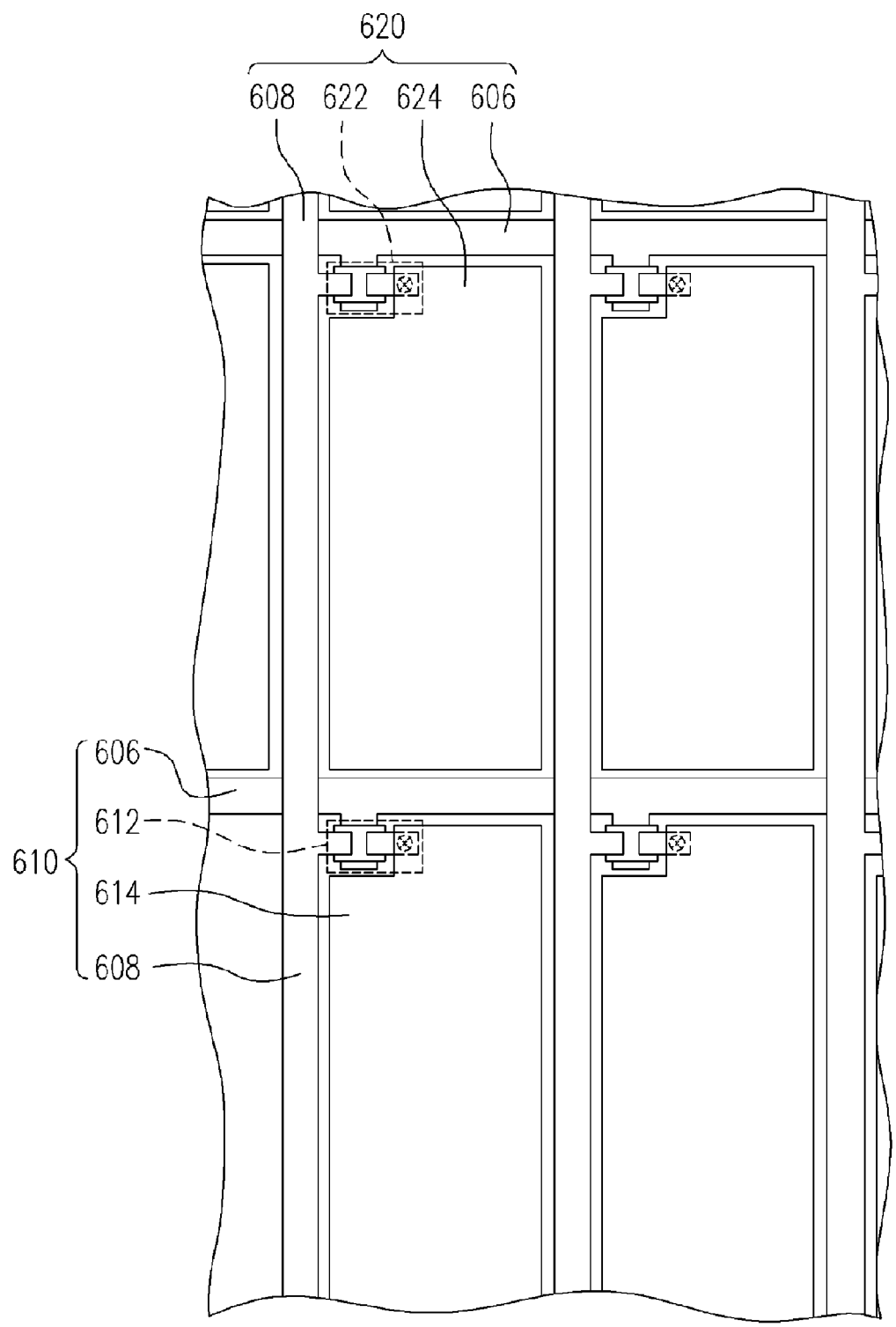
FIG. 6 is a schematic diagram showing part of a general array of active devices.
Figure 7:
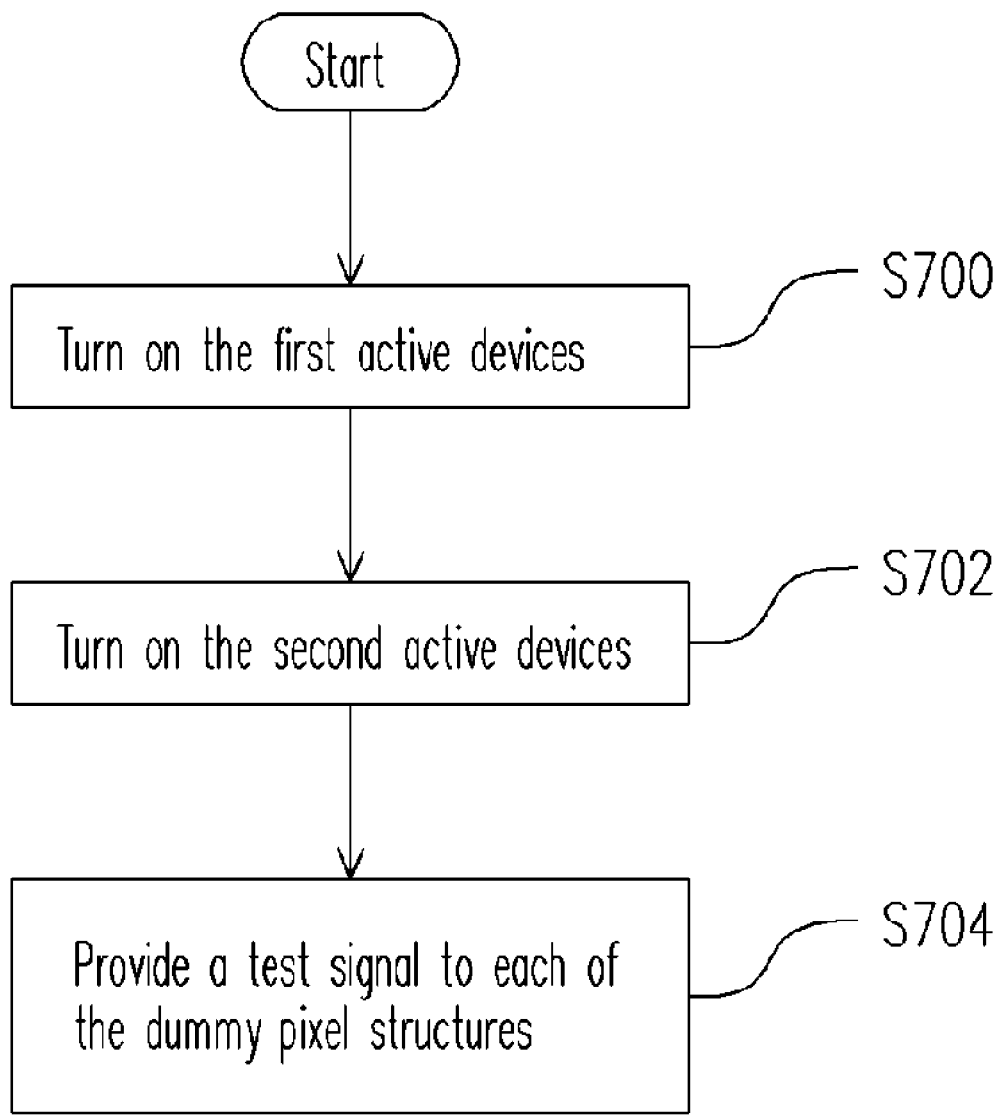
FIG. 7 is the flow chart of a method for testing an array of active devices according to an embodiment of the present invention.

FIG. 6 is a schematic diagram showing part of a general array of active devices. FIG. 7 is the flow chart of a method for testing an array of active devices according to an embodiment of the present invention. Please refer to FIG. 6 first, the array 600 of active devices has a plurality of pixel structures 610 positioned in the display area 602, and a plurality of dummy pixel structures 620 positioned in the peripheral area 604. The pixel structures 610 share the scan lines 606 and the data lines 608 with the dummy pixel structures 620. In other words, the dummy pixel structures 620 are connected to the pixel structures 610 by way of the scan lines 606 or the data lines 608. Besides, the pixel structures 610 further comprise the first active devices 612 and the pixel electrodes 614. The first active devices 612 are connected to the scan lines 606 and the data lines 608, and the pixel electrodes 614 are connected to the first active devices 612. Similarly, the dummy pixel structures 620 further comprise the second active devices 622 and the dummy pixel electrodes 624. The second active devices 622 are connected to the scan lines 606 and the data lines 608, and the dummy pixel electrodes 624 are connected to the second active devices 622.

Please refer to FIG. 6 and FIG. 7, in the test of the array 600 of active devices, the first active devices 612 are turned on first, as described in step S700. The first active devices 612 are turned on by, for example, providing signals to the scan lines 606 connected to the first active devices 612. And then the flow proceeds to step S702 to turn on the second active devices 622. Similarly, the second active devices 622 are turned on by providing signals to the scan lines 606 connected to the second active devices 622.

And then in step S704, test signals are provided to each of the dummy pixel structures 620 to transmit the test signals to the pixel structures 610 via the dummy pixel structures 620 to test the pixel structures 610. Here the test signals are provided by, for example, inputting the test signals to the dummy pixel electrodes 624. In an embodiment of the present invention, the test signals are provided, for example, through probes (not shown) to the dummy pixel electrodes 624. At this moment, the second active devices 622 are already turned on, the test signals are transmitted to the data lines 608 via the dummy pixel electrodes 624, and then transmitted to the pixel electrodes 614 of each of the pixel structures 610 via the data lines 608 to test the functions of the pixel structures 610.

Based on the above, this embodiment uses the dummy pixel electrodes 624 in the dummy pixel structures 620 directly as test pads to test the pixel structures 610. In other words, the array 600 of active devices does not need extra test pads to receive test signals. This feature not only saves the layout space of the array 600 of active devices, but also saves its fabrication cost.

In total, the sizes of the test pads in the arrays of active devices according to the present invention are sufficient to enable test operators to easily place the probes on correct test pads in the circuit test. In other words, the present invention helps to reduce the difficulty of the circuit test on arrays of active devices. In addition, it is no longer necessary to spend precious budgets on expensive probes with high accuracy.

Besides, the distances between test pads of the arrays of active devices according to the present invention are also sufficient to prevent test signals on adjacent test pads from interfering with one another in the circuit test. Therefore, it is feasible to obtain test results with high accuracy from the arrays of active devices according to the present invention.

Moreover, the method for testing an array of active devices according to the present invention not only saves the layout space of test pads on conventional display panels, but also saves a step to fabricate the test pads so that the fabrication cost of arrays of active devices is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An array of active devices, comprising:
   a substrate comprising a display area and a peripheral area;
   a plurality of scan lines positioned on the substrate;
   a plurality of data lines positioned on the substrate, wherein the data lines and the scan lines enclose a plurality of pixel areas in the display area and enclose a plurality of dummy pixel areas in the peripheral area;
   a plurality of pixel units, positioned on the substrate and in the pixel areas, connected to the scan lines and the data lines, respectively; and
   a plurality of first test pads, positioned in the dummy pixel areas, wherein each of the first test pads is connected to one of the data lines.

2. The array of active devices of claim 1, wherein each of the pixel units comprises:
   a first active device connected to the corresponding scan line and the corresponding data line; and
   a pixel electrode connected to the first active device.

3. The array of active devices of claim 2, wherein the pixel electrodes are formed of Indium Tin Oxide (ITO) or Indium Zinc Oxide (IZO).

4. The array of active devices of claim 1, wherein the first test pad are formed of Indium Tin Oxide (ITO) or Indium Zinc Oxide (IZO).

5. The array of active devices of claim 4, further comprising
   a plurality of second active devices, positioned on the substrate and in the dummy pixel areas and electrically connected with the first test pads, wherein the second active devices are always turned on and each first test pad is connected to the corresponding data line through the corresponding second active device.

6. The array of active devices of claim 5, wherein the second active devices are thin film transistors, and the source terminal and the drain terminal of each of the thin film transistors are connected together.

7. The array of active devices of claim 1, wherein the first test pads are formed of metal.

8. The array of active devices of claim 7, further comprising a plurality of transparent electrodes, positioned in the dummy pixel areas between the pixel units and the first test pads, wherein each of the transparent electrodes electrically connects with the corresponding data line, and the transparent electrodes and the first test pads together serve as test pads.

9. The array of active devices of claim 1, further comprising a plurality of second test pads, positioned in the peripheral area and close to the scan lines, wherein each of the second test pads is connected to one of the scan lines.

10. The array of active devices of claim 9, wherein each of the pixel unit further comprises a storage capacitor, and the array of active devices further comprises a plurality of bus electrodes positioned in the peripheral area and electrically connected to the storage capacitors, wherein each second test pad is positioned between two of the bus electrodes.

11. The array of active devices of claim 9, further comprising a plurality of dummy pixel units positioned in the dummy pixel areas between the pixel units and the second test pads.

* * * * *